(12) United States Patent
Crescenzi, Jr. et al.

(10) Patent No.: US 6,681,483 B2
(45) Date of Patent: Jan. 27, 2004

(54) MULTI-LAYER RF PRINTED CIRCUIT ARCHITECTURE WITH LOW-INDUCTANCE INTERCONNECTION AND LOW THERMAL RESISTANCE FOR WIDE-LEAD POWER DEVICES

(75) Inventors: E. James Crescenzi, Jr., Cupertino, CA (US); Anwar A. Mohammed, San Jose, CA (US)

(73) Assignee: Remec, Inc., Del Mar, CA (US)

( * ) Notice: Subject to any disclaimer, the term of this patent is extended or adjusted under 35 U.S.C. 154(b) by 0 days.

(21) Appl. No.: 10/125,221

(22) Filed: Apr. 18, 2002

(65) Prior Publication Data
US 2002/0113673 A1 Aug. 22, 2002

Related U.S. Application Data

(62) Division of application No. 09/489,505, filed on Jan. 21, 2000, now Pat. No. 6,466,113.
(60) Provisional application No. 60/116,653, filed on Jan. 22, 1999.

(51) Int. Cl.[7] ................................................. H01K 3/10
(52) U.S. Cl. ............................. 29/852; 29/840; 29/846; 333/247; 257/728; 361/795
(58) Field of Search ........................ 29/840, 846, 852; 174/266, 261; 333/247, 246; 257/728; 361/794–795

(56) References Cited

U.S. PATENT DOCUMENTS

| | | | |
|---|---|---|---|
| 4,739,448 A | | 4/1988 | Rowe et al. ................. 361/386 |
| 4,975,142 A | * | 12/1990 | Iannacone et al. ............. 216/18 |
| 5,227,013 A | * | 7/1993 | Kumar ......................... 216/18 |
| 5,347,712 A | * | 9/1994 | Yasuda et al. ................. 29/852 |
| 6,178,093 B1 | * | 1/2001 | Bhatt et al. .................. 361/795 |
| 6,235,991 B1 | | 5/2001 | Johnson ....................... 174/70 |

FOREIGN PATENT DOCUMENTS

| | | | |
|---|---|---|---|
| GB | 1 257 770 | 12/1970 | ............ H05K/3/36 |

* cited by examiner

*Primary Examiner*—Richard Chang
(74) *Attorney, Agent, or Firm*—Allen, Dyer, Doppelt, Milbrath & Gilchrist, P.A.

(57) ABSTRACT

A printed circuit architecture includes a relatively thick, stiffening base of thermally and electrically conductive material, and a laminate of conductive layers including a printed circuit structure, interleaved with dielectric layers, disposed atop the base. The patterned conductive layers contain an integrated circuit structure that is configured to provide RF signaling, microstrip shielding, and digital and analog control signal leads, and DC power. Low inductance electrical connectivity among the conductive layers and also between conductive layers and the base is provided by a plurality of conductive bores. Selected bores are counter-drilled at the RF signaling layer and filled with insulating plugs, which prevent shorting of the RF signal trace layer to ground, during solder reflow connection of leads of circuit components to the RF signaling layer.

9 Claims, 6 Drawing Sheets

MULTI-LAYER RF PRINTED CIRCUIT ARCHITECTURE WITH LOW-INDUCTANCE INTERCONNECTION AND LOW THERMAL RESISTANCE FOR WIDE-LEAD POWER DEVICES

CROSS-REFERENCE TO RELATED APPLICATION

The present application is a divisional of application Ser. No. 09/489,505 filed Jan. 21, 2000 now U.S. Pat. No. 6,466,113, which claims the benefit of previously filed co-pending Provisional Patent Application, Ser. No. 60/116,653, filed Jan. 22, 1999.

FIELD OF THE INVENTION

The present invention relates in general to communication circuits and components and support structures therefor, and is particularly directed to a new and improved multi-layer printed circuit architecture for high power RF devices that provides low-inductance and low thermal resistance interconnections to a relatively thick, thermal dissipation, ground plane support substrate.

BACKGROUND OF THE INVENTION

Associated with continuing improvements in component micro-miniaturization, integration density and operational frequencies of signal processing and communication circuits, especially those employed in high frequency and high power RF applications, are packaging design and fabrication techniques that will facilitate the practical implementation of an integrated circuit architecture. As diagrammatically illustrated in FIG. 1, a typical printed circuit board structure, such as that employed for RF applications, is configured as a multi-layered laminate of dielectric layers (D1, D2, D3) interleaved with patterned conductive layers (L1, L2, L3), which respectively provide RF signaling and shielding, digital and analog control, and DC power functions.

This multi-layer laminate is supported atop a conductive (e.g., copper) ground plane substrate L4, that may serve as or be attached to a thermal dissipation medium, serving as a ground plane and mechanically stable support. Integrated circuit components and devices 10 may be surface-mounted to signal traces of the topside patterned conductor layer L1 formed on the relatively thick dielectric layer D1. The multi-layer laminate structure contains a distribution of conductively plated through-holes or vias (one of which is shown at 20), which provide 'vertical' or 'through-the-stack' interconnections among the various conductive layers of the laminated structure.

As shown in the interconnect schematic diagram of FIG. 2, such plated through-holes typically include the following: 1) through-hole interconnects 21 between the (RF signaling) conductive layer L1 and the (analog and digital signaling) layer L3; 2) through-hole interconnects 22 between (microstrip ground/RF shielding) layer L2 and the underlying ground plane and thermal dissipation support plate L4; and 3) through-hole interconnects 23 among the RF signaling layer L1, the microstrip ground layer L2 and the ground plane and thermal dissipation support plate L4.

In order to ensure proper operation of the composite circuit architecture, it is essential to minimize the reactance (parasitic capacitance, and inductance in particular) of interconnects. This mandates the use of shorter sections of conductive material, particularly at higher RF frequencies. Since the effective length of a section of interconnect includes both the vertical plated through-hole dimension and the horizontal dimension of a patterned conductive layer Li to which it is joined, a very efficacious technique to minimize grounding lead inductance is to fabricate such leads as a large number of closely spaced plated ground interconnect vias 22, that extend between the RF ground/shielding layer L2 and the bottom ground plate L4.

Unfortunately, this gives rise to a significant fabrication issue—ensuring that the plated ground vias 22 between the bottom layer L4 and RF ground/shield layer L2 do not extend all the way through the topside dielectric layer D1. If they did, the vias 22 would intersect the RF signal trace layer L1, and thereby short the RF signaling layer L1 to ground during a solder reflow step customarily used in the fabrication process. The basic problem is the substantial thickness of the copper substrate L4 upon which the interleaved dielectric and conductive layer laminate is mounted. In particular, providing the ground interconnects 22 requires the formation of conductive through holes through the stack between the RF shielding layer L2 and the ground plane layer L4.

One way to form the RF shield to ground vias 22 would be to drill holes from the bottom surface of the layer L4 up into the laminate, so as to intersect the RF shield layer L2. However, this approach demands a very exact (and therefore prohibitively expensive) vertical drilling depth through the dielectric—patterned conductor stack. This is especially true, if ground plane layer L4 has substantial thickness. The hole depths would have to be sufficient to intersect the target RF shield layer L2, but not puncture the topside dielectric layer D1. It may be noted that the problem cannot be avoided by simply increasing the thickness of the dielectric layer D1 (in order to increase the tolerance of the drill depth), since the characteristics of the dielectric layers (particularly those of the topside dielectric layer D1), including thickness and dielectric properties, must be tailored for proper circuit operation.

SUMMARY OF THE INVENTION

In accordance with the present invention, the above-described problems are effectively obviated by a new and improved multi-layer printed circuit architecture and fabrication process therefor, that facilitates forming a large number of closely spaced plated vias between a robust underlying ground plane support pallet and the RF shielding layer, in a manner that minimizes interconnect inductance, while at the same time preventing unwanted shorting of the RF signal trace layer to ground, during solder reflow for connection to 'wide lead' power devices.

By 'wide lead' is meant an interconnect medium having a dimension equal to or greater than one-twentieth of a wavelength of propagation within the dielectric material of the RF transmission line. The invention successfully addresses the issue of inductance in the ground return path of the high power device to be mounted in a device well. The sensitivity of the path between the RF shielding layer and the base of the device (which is attached to the underlying ground plane pallet) varies according to the input and output impedances of the device. For large power transistors, these impedances are very low, and the circuit is very sensitive to stray inductance.

As will be described, the multilayer printed circuit structure of the invention includes an interleaved laminate of patterned dielectric layers and patterned conductive layers. The conductive layers are used for RF signaling, RF microstrip shielding/ground, digital and analog control signal leads, and DC power. A vertical interconnect between the RF signaling layer and the control/DC conductive layer is provided by way of a plated bore that intersects material of each of these conductive layers. The RF shielding layer is patterned adjacent to the bore, so as to be laterally offset from bore and thereby prevent conductive material plated in the bore from electrically bridging the RF shielding layer.

A vertical interconnect that joins the RF signaling layer, the RF microstrip shielding layer and the underlying ground plane support pallet is realized by forming a plated bore completely through the laminate structure from the RF signaling layer down through the bottom dielectric layer and into or through the conductive pallet. The support pallet preferably comprises a relatively thick metallic substrate, that is patterned to provide recesses of appropriate depth that conform with each of device capture slots and bores in the laminate structure. Although this bore intersects each of the RF signaling layer and the RF microstrip layer, the DC/control layer is patterned so that the plated bore is laterally offset from it, to prevent the plated bore from contacting the DC/control layer.

In the course of forming a vertical interconnect that electrically joins the RF microstrip shielding layer with the underlying ground plane support pallet, a further bore is drilled completely through the laminate structure from the RF signaling layer down to and at least partially through the ground plane pallet. The further bore intersects each of the RF signaling layer and the microstrip shielding layer; however, the DC/control layer is patterned so as to be laterally offset from the further bore, to prevent conductive material plated in the bore from contacting the DC/control layer.

The bores used for ground plane interconnections are preferably formed through the overall laminate structure (including the pallet) after the conductor—dielectric laminate structure has been bonded to the pallet. The bores are then plated to interconnect the RF signaling layer to the bottom of each bore. Although this operation provides the intended interconnects for the RF signaling layer, it results in an unwanted shorting of the RF signaling layer to the vertical interconnect between the RF shield layer and the support pallet.

Pursuant to the invention, this problem is obviated by counter-drilling the plated bore used for the vertical interconnect between the RF shield layer and the ground plane pallet with an oversized drill, to form an oversized counterbore that extends to a prescribed depth from the RF signaling layer into the topside dielectric layer. Because the counter-drilling of this bore is from the top surface of the laminate and directly into the relatively thicker topside dielectric layer, precise control of the depth of the counterbore is readily achieved. In addition, the radius of the counter-drill is sufficiently larger than the radius of the bore per se, so that the circular perimeter of the counterbore overlaps and removes a prescribed portion of the conductive material plated in the bore.

The upper portions of the bores are then filled with electrically insulating (e.g., epoxy, glass, or other suitable insulating material) plugs. Because the counter-drilled bore no longer has plated material intersecting the RF signaling layer, its non-conductive plug provides an insulating barrier between the RF signaling layer and the plated conductor remaining in the bore. The conductive material remaining in the bore beneath the plug still provides the intended interconnect between the RF shielding layer and the ground plane pallet.

This insulator-filled counterbore structure allows a large number of such bores to be placed immediately adjacent to well regions where high power devices, such as RF power transistors and the like, are installed, so as to provide low inductance electrical and thermal interconnects between the RF ground, common terminals of such devices, and the ground plane/heat sink pallet, without the danger of being shorted to the topside RF signaling layer, during solder reflow of interconnect leads for the topside RF signaling layer and the well-installed device.

DETAILED DESCRIPTION

Figure 2:
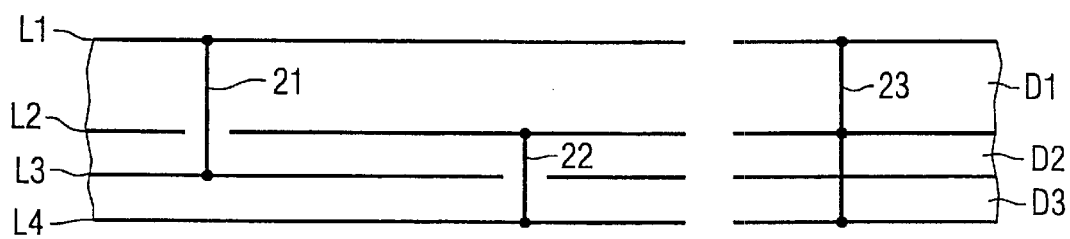
FIG. 2 is an interconnect schematic diagram associated with the printed circuit board laminate structure of FIG. 1.
Figure 3A:
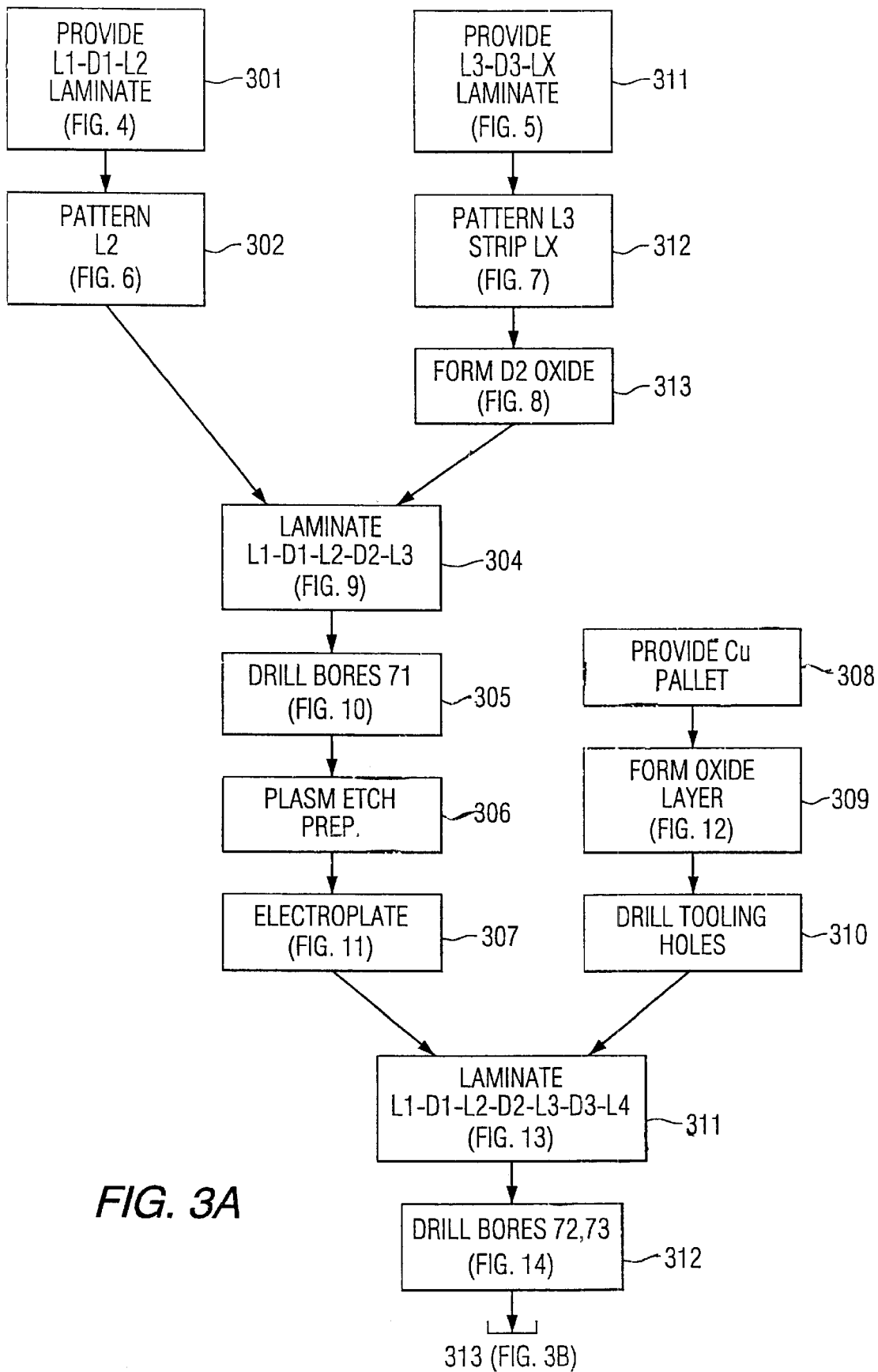
FIGS. 3A and 3B contain a flow chart containing respective steps of a processing flow sequence for fabricating a multi-layer printed circuit architecture in accordance with the present invention.
Figure 3B:
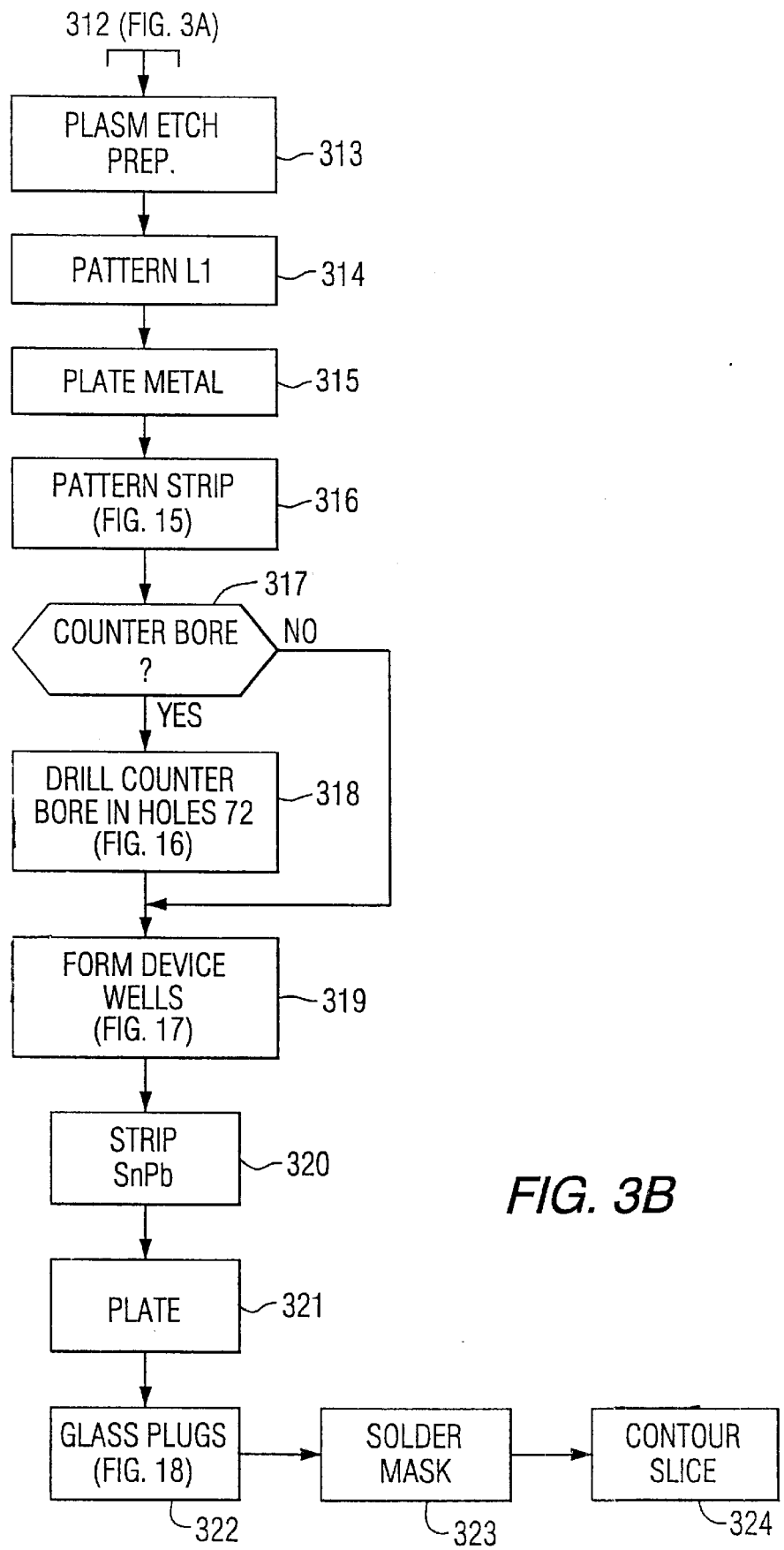

Attention is now directed to FIGS. 3A and 3B, which show respective steps of a processing flow sequence for fabricating a multi-layer printed circuit architecture in accordance with the present invention, and FIGS. 4–18, which are reduced complexity cross-sectional illustrations of the multi-layer printed circuit architecture associated with the respective steps of the processing flow sequence of FIG. 3. For purposes of providing a non-limiting example, the present invention will be described for the case of implementing a multi-layer printed circuit architecture that contains a four conductor (L1–L4), three dielectric (D1–D3) laminate employing the three types of vertical interconnects shown schematically at 21, 22 and 23 in the interconnect diagram of FIG. 2.

The process begins by preparing and laminating together a plurality (three in the present example) of patterned metal-coated dielectric layers into a composite assembly. This assembly, in turn, is then laminated or bonded onto an underlying metal pallet. The resulting structure is then subjected to further processing, including the counter-drilling and insulator fill operation of the present invention, described briefly above.

Figure 4:
FIGS. 4–18 are reduced complexity cross-sectional illustrations of the multi-layer printed circuit architecture associated with the respective steps of the processing flow sequence of FIGS. 3A and 3B.

More particularly, at a step 301, a first, dual metalized layer of dielectric material D1 for the RF or microwave signaling portion of the structure is provided, as shown in FIG. 4. As a non-limiting example dielectric layer D1 may comprise a layer of RO4350 dielectric material supplied by Rogers Corp., having a thickness on the order of 20 mils, and its upper and lower surfaces coated with conductive material, such as respective one ounce copper, to form the first and second conductive layers L1 and L2.

Figure 1:
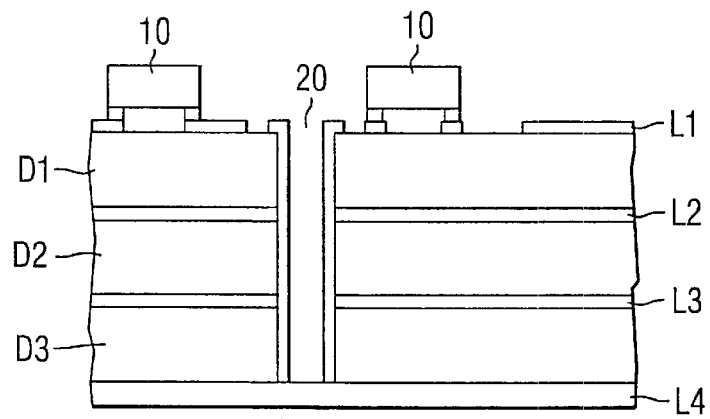
FIG. 1 diagrammatically illustrates a printed circuit board structure configured as a multi-layered laminate of dielectric layers and patterned conductive layers atop a relatively thick, thermal dissipation, ground plane support.

The thickness of the dielectric layer D1 is defined, so as to provide a prescribed transmission line impedance at the intended operational frequency of the RF circuit. As in the structure of FIG. 1, the upper or topside metal layer L1 is employed for RF signaling, while the lower metal layer L2 serves as the RF ground/shield of the transmission line.

Figure 5:

In a parallel step 311, a dual metalized layer of dielectric material D3, shown in FIG. 5, upon which the DC/control signaling portion of the structure is supported, is provided. As a non-limiting example, the dual metalized dielectric layer D3 may comprise a commercially available metalized dielectric FR-4 laminate having a thickness on the order of four mils, and both its upper and lower surfaces coated with one ounce copper layer.

Figure 6:
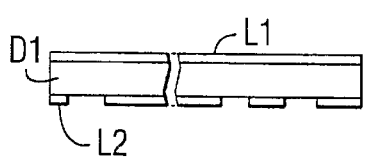
Figure 7A:
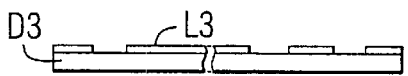
Figure 7B:
Figure 8:
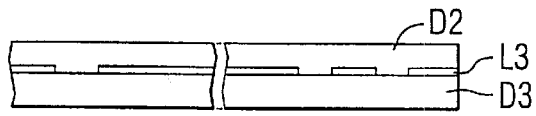

In step 302, the RF ground plane metal L2 of the dielectric layer D1 is selectively patterned to realize the structure shown in FIG. 6, while in companion step 312, the DC/control metal layer L3 on dielectric layer D3 is selectively patterned and the lower metal layer on bottom surface of dielectric layer D3 is completely stripped off, thereby realizing the structure shown in FIG. 7A. In step 313, the metallic layer L2 undergoes surface oxidation (of the copper) to prepare it for bonding with an FR4 prepreg layer which, after curing, constitutes the dielectric layer D2, shown in FIG. 7B. As shown in FIG. 8, dielectric layer D2 serves as the bonding vehicle between patterned conductor L2 of dielectric layer D1 (FIG. 6) and metal layer L3 patterned atop dielectric layer D3 (FIG. 7A).

Figure 9:
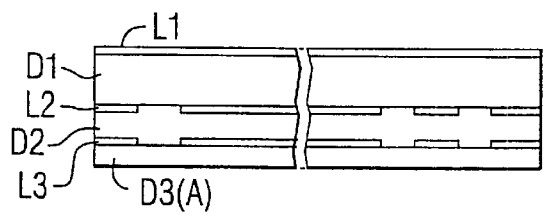
Figure 10:
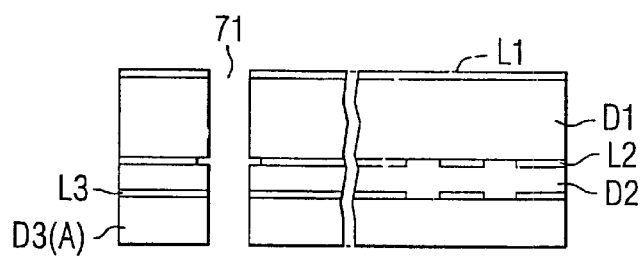

Next, in step 304, using a standard adhesive (prepreg), the metalized dielectric layers D1, D2 and the upper portion D3(A) of layer D3 of FIGS. 6 and 8 are bonded together to form the multilayer metal and dielectric laminate structure of FIG. 9. In step 305, a set of blind vias or through holes for providing the vertical ground interconnect 21 that electrically joins the RF signaling layer L1 with the underlying ground DC/control layer L3, is realized by forming respective bores, one of which is shown at 71 in FIG. 10, completely through the laminate structure from the RF signaling layer L1 down through the upper portion D3(A) of dielectric layer D3.

Although the bore 71 intersects material of each of the RF signaling layer L1 and the conductive layer L3, it may be noted that the RF shielding layer L2 has been patterned adjacent to the bore 71 in step 302, so that the bore 71 does not intersect, but is laterally offset from, the RF shielding layer L2. This patterned offset prevents conductive material formed (e.g., plated) in the bore 71 from contacting RF shielding layer L2.

Next, in step 306, the bores 71 and the metal layer L1 are exposed to a plasma etch to prepare their surfaces for an electrolytic metallic plate. Then, in step 307, a suitable conductive metal, such as copper, as a non-limiting example, is electroplated onto the metal layer L1 and into the bores 71, to produce the electroplated plated structure shown in FIG. 11, which is to be bonded to a relatively thick ground plane pallet L4.

For this purpose, at step 308 a relatively thick (e.g., on the order of 60+ mils) copper plate to serve as the underlying ground plane layer L4 is provided. Next, in step 309, the pallet L4 undergoes surface layer oxidation, to prepare it for bonding with an FR4 prepreg layer (the lower portion D3(B) of dielectric layer D3), and then is integrated with the previously formed laminate of L1-D1-L2-D2-L3-(upper portion D3(A) of layer D3), to form the structure of FIG. 12.

Figure 11:
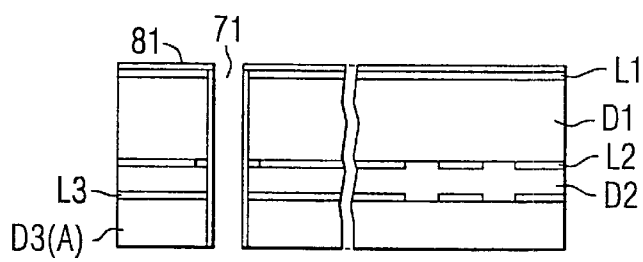
Figure 12:
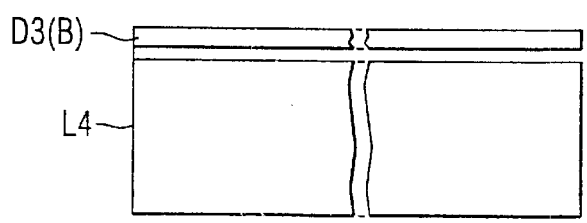
Figure 13:
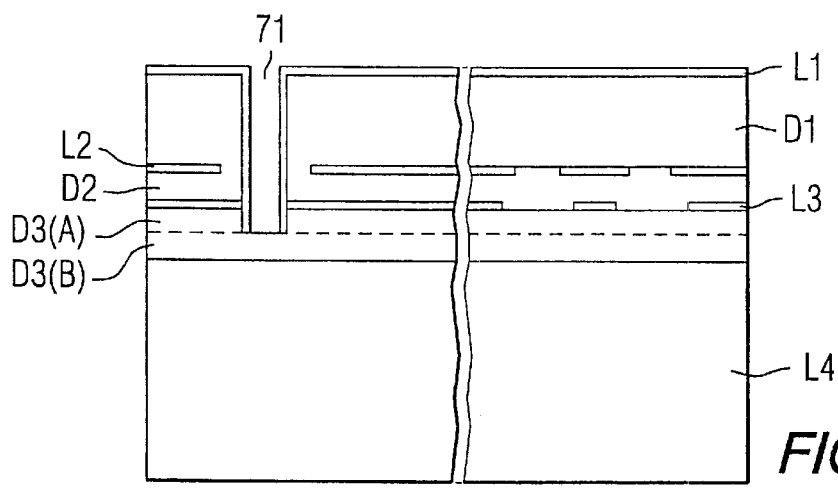

In step 310, suitable tooling holes (not shown) are drilled into the pallet layer L4 for holding the structure during subsequent processing. Then, in step 311, using a suitable prepreg material, the laminate structure L1-D1-L2-D2-L3-D3(A) of FIG. 11 is bonded to the oxide-coated pallet D3(B)-L4 of FIG. 12, to obtain the composite laminate structure L1-D1-L2-D2-L3-D3-L4 of FIG. 13.

Figure 14:
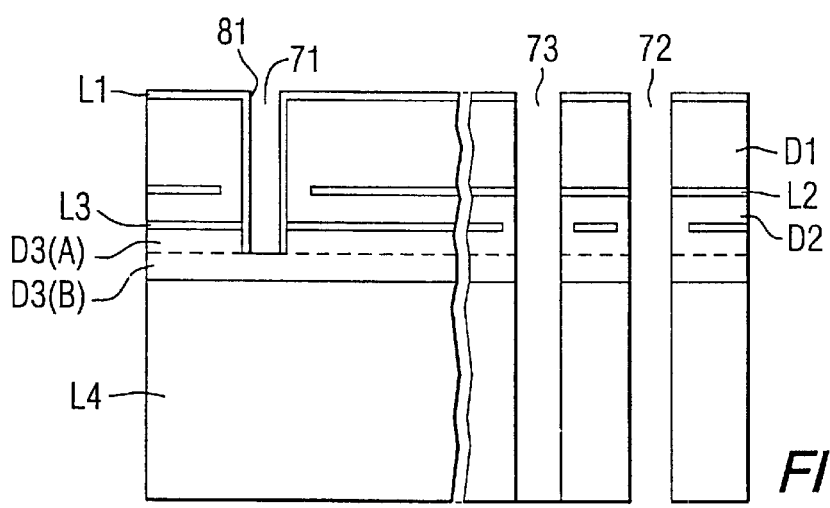
Figure 15:
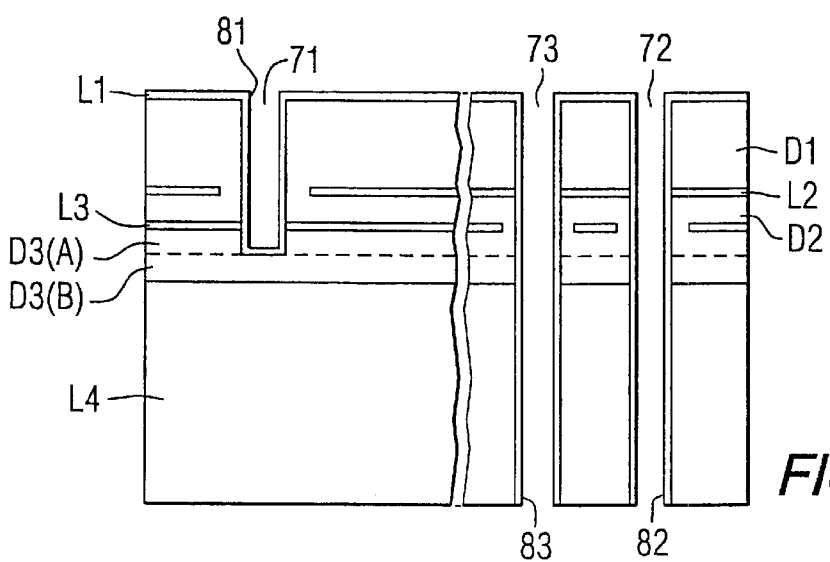

Once the overall laminate structure has been assembled in step 311, through holes or bores 72 that provide vertical interconnect 22 to electrically join RF shielding layer L2 with underlying ground plate L4, and bores 73 that provide vertical interconnect 23 electrically joining the RF signaling layer L1 and the RF shielding layer L2 with the underlying ground plane pallet L4, are formed in step 312. Each of bores 72 and 73 may be formed by drilling a plurality of holes completely through the laminate structure from RF signaling layer L1 down through ground plane pallet L4, as shown in FIG. 14.

Bore 72 intersects each of the RF signaling layer L1 and the RF shielding layer L2. However, as the DC/control layer L3 has been patterned in step 312 adjacent to where the bore 72 is drilled, the bore 72 is laterally offset from the DC/control layer L3, to prevent conductive material to be plated into the bore 72 from contacting the DC/control layer L3. Similarly, bore 73 intersects each of RF signaling layer L1 and RF shielding layer L3. However, the RF shielding layer L2 has been patterned in step 302 adjacent to the bore 73, so that the bore 73 is laterally offset therefrom, to prevent conductive material to be plated in bore 73 from contacting RF ground layer L3.

As described briefly above, the bores 72, in which vertical interconnects 22 between the RF shielding layer L2 with the underlying ground plate L4 are formed, are spatially located so as to be immediately adjacent (i.e., as is close as practically possible to fabricate) to locations where wells for devices such as 'wide lead' power transistors are to be formed (in step 321, to be described).

As pointed out above, by 'wide lead' is meant an interconnect medium having a dimension equal to or greater than one-twentieth of a wavelength of propagation within the dielectric material of the RF transmission line. As a non-limiting example, at a frequency on the order of 2.5 GHz, the lead dimension may be on the order of 0.13 inches. Typically, wide lead power devices may have lead widths on the order of 0.20 to 0.50 inches.

In step 313, the bores and the topside metal layer L1 are exposed to a plasma etch to prepare their surfaces for a further metallic plate in subsequent step 315. Prior to this further metal plating operation, the RF signaling layer L1 is patterned in step 314, to remove L1 material at regions 84 therethrough. The patterned RF signaling L1 and the bores are then plated in step 315 with a suitable conductor (e.g., Cu), followed by a pattern mask strip operation in step 316, leaving the plated structure of FIG. 15.

Next, in query step 317, those ones of plated holes 71, 72 and 73, which are to be counter-drilled (i.e., holes 72), are identified. For those holes (i.e. holes 71 or 73) that are not to be counter-drilled (the answer to query step 317 is NO), the processing routine transitions to step 319. However, if a respective hole (hole 72) is to be counter-drilled (the answer to query step 317 is YES), the processing routine transitions to counter-drill step 318.

Figure 16:
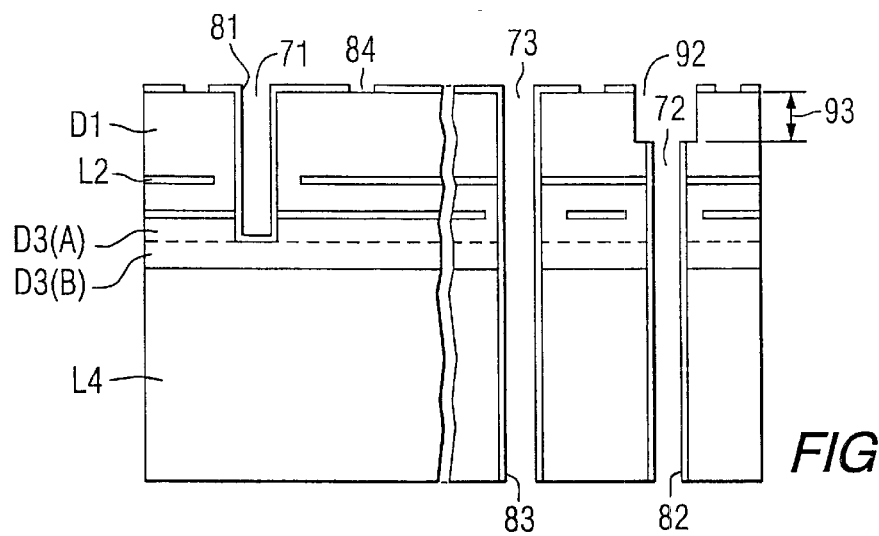

As described above, pursuant to the invention, the counter-drilling of bores 72 (step 318) prevents unwanted shorting of the vertical interconnect 22, that extends to and intersects the ground plane pallet L4, to the RF signaling layer L1. In particular, as shown in FIG. 16, each of the holes 72 is subjected to a counter-drilling operation using an oversized drill to bore a larger diameter hole or oversized counterbore 92 through the RF signaling layer L1 to a prescribed depth 93 into the dielectric layer D1.

Because the counter-drilling of bores 72 is from the top surface of the laminate structure and directly into the relatively thicker dielectric layer D1, precise control of the depth 93 of the counterbore 92 is readily achieved. The radius of the counterbore 92 is preferably sufficiently larger than the radius of the bore 72, so that the circular perimeter of the counterbore 92 overlaps that of bore 72, thereby removing not only additional material of the RF signaling layer L1 and dielectric layer D1, but also a depth of the plated conductive material 82 in the bore 72 that had been joined to topside RF signaling layer L1 in plating step 315.

Figure 17:
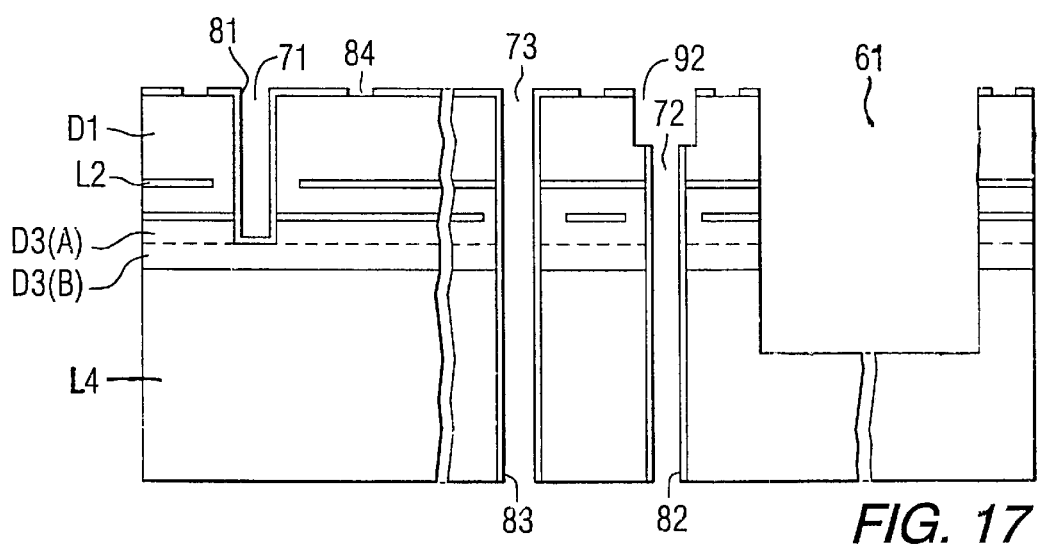
Figure 18:
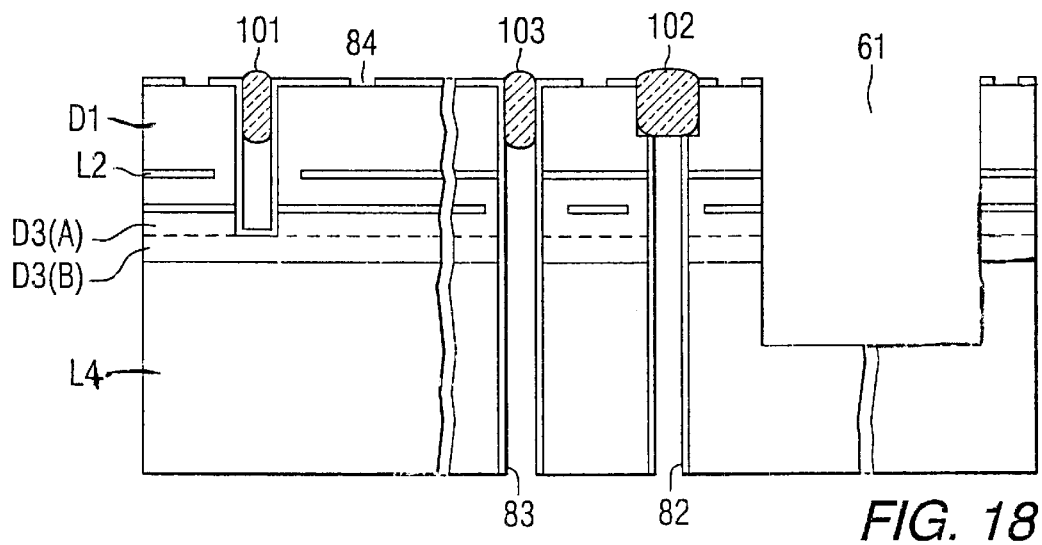

Once counterboring of all holes 72 has been completed, a routing step 319 is performed, to form one or more slots or wells 61 for receiving circuit devices, such as power transistors, as shown in FIG. 17. Because the ground plane pallet L4 is relatively thick, the depths of the wells 61 may be variably dimensioned, to facilitate mounting different sized circuit devices therein, so that the devices may have their terminal contacts positioned at the proper height above the top surface of the laminate for effectively 'common-plane' interconnections with the adjacent RF signaling layer L1.

Next, in step 320, the SnPb mask is stripped so that all exposed metal is copper. Then, in step 321, metal in the bores and layer L1 are chemically plated with a suitable protective alloy, such as Ni/Au. This plate does not deposit on dielectric material. In step 322, a suitable insulating material, such as epoxy, is introduced to a prescribed depth in each of the holes 71, 72 and 73, forming a set of dielectrically insulating plugs 101, 102 and 103, respectively, shown in FIG. 18.

Because the walls of the counterbore 92 contain no metal that would otherwise conductively join the RF signaling layer L1 with any of the metal layers L2, L3 or L4, (epoxy) plug 102 forms a substantial insulating barrier between the RF signaling layer L1 and plated conductive material 82 remaining in the bore 72. The conductive material 82 remaining in the bore 72 provides the intended interconnection 22 between microstrip shielding layer L2 and the ground plate L4, without unwanted shorting of the vertical interconnects 22 to the topside RF signaling layer L1 during solder reflow for the RF signaling layer L1.

This dielectric-filled counterbore structure thereby allows placement of closely spaced interconnect bores 72 at locations of the printed circuit board, in particular as immediately adjacent to regions (wells) 61 where high power devices, such as transistors and the like, are installed, and provides low inductance electrical and thermal interconnects between the microstrip ground, common terminals of such devices, and the backing support ground plane/heat sink layer L4. Next in step 323, a solder mask for subsequent lead connections between circuit devices and the RF layer L1 is formed. Then, in step 324, the laminate is separated into respective printed circuit boards for subsequent component population during final fabrication.

As will be appreciated from the foregoing description, by means of a dielectric filled counterbore, the multi-layer printed circuit architecture and fabrication process of the present invention facilitates forming a large number of closely spaced, low inductance plated vias between the underlying ground plane, heat sink pallet and the microstrip shielding layer, minimizing interconnect inductance, while at the same time preventing unwanted shorting of the RF signal trace layer to ground, during solder reflow connection of circuit components to the RF signaling layer. Because the counter-drilling of the ground connect bore is from the top surface of the laminate and directly into a relatively thicker topside dielectric layer, precise control of the depth of the counterbore is readily achieved.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed is:

1. A method of fabricating a printed circuit structure comprising the steps of:

(a) providing a laminate structure containing a base layer of thermally and electrically conductive material, and a plurality of conductive layers interleaved with dielectric layers disposed atop said base layer;

(b) forming a first aperture through said laminate structure;

(c) forming conductive material in said first aperture, so as to conductively connect said base layer with at least one of said conductive layers (d) removing conductive material formed in step (c) from a prescribed depth portion of said first aperture, in a manner that leaves said base layer conductively connected with said at least one of said conductive layers, but conductively disconnected from one or more of said conductive layers intersected by said prescribed depth portion of said first aperture; and (e) forming dielectric material in said prescribed depth portion of said first aperture and forming a recess within the laminate structure and sized to receive a circuit component, installing the circuit component within the recess, and connecting the circuit component and a conductive layer intersected by the prescribed depth portion of the first aperture without conductively interconnecting the base layer and conductive layer.

2. A method according to claim 1, wherein step (d) comprises increasing the size of said prescribed depth portion of said first aperture, and step (e) further comprises forming dielectric material in the increased sized prescribed depth portion of said first aperture.

3. A method according to claim 1, wherein step (b) further comprises forming a second aperture partially through said plurality of conductive layers and interleaved dielectric layers to a depth such that second aperture does not intersect said base layer, and step (c) comprises forming conductive material in said first and second apertures, so as to conductively connect said base layer with at least one conductive layer intersected by said first aperture, and so as to conductively interconnect plural ones of said conductive layers by way of said second aperture.

4. A method according to claim 3, wherein step (b) further comprises forming a third aperture through said laminate structure, and step (c) comprises forming conductive material in each of said first, second and third apertures, so as to conductively connect said base layer with at least one conductive layer intersected by said first aperture, to conductively interconnect plural ones of said conductive layers by way of said second aperture, and conductively connect said base layer with at least one conductive layer intersected by said third aperture.

5. A method according to claim 1 and further including the steps of:

(f) performing a solder reflow connection between said circuit component and conductive layer intersected by said prescribed depth portion of said first aperture, such that said dielectric material formed in said prescribed depth portion of said first aperture prevents solder from conductively interconnecting said base layer with said conductive layer intersected by said prescribed depth portion of said first aperture.

6. A method according to claim 1, wherein said base layer has a thickness greater than the total thickness of said plurality of conductive layers and said dielectric layers.

7. A method of fabricating a printed circuit structure comprising the steps of:

providing a base of thermally and electrically conductive material and a laminate of conductive layers including a printed circuit structure, interleaved with dielectric layers, disposed against the base;

forming a first aperture through the laminate structure such that a first portion contains conductive material that conductively connects the base layer with at least one of the conductive layers, and a second portion that is absent conductive material, so as to leave the base layer conductively connected with the at least one of the conductive layers, but conductively disconnected from one or more of the conductive layers intersected by said second portion of the first aperture;

forming a second aperture that extends partially through the plurality of conductive layers and interleaved dielectric layers to a depth such that the second aperture does not intersect the base layer, and contains conductive material that conductively interconnects plural ones of the conductive layers; and forming a recess containing a circuit component and connecting the conductive layer intersected by a prescribed depth portion of the first aperture without conductively interconnecting the base layer and conductive layer.

8. A method according to claim 7, and further comprising the step of forming a third aperture that extends through the laminate structure and containing conductive material that conductively connects the base layer with at least one conductive layer intersected by the aperture.

9. A method according to claim 7, and further comprising the steps of forming solder connections between leads of the circuit component and conductive layer intersected by a prescribed depth portion of the first aperture, such that solder of the solder connections is prevented by a dielectric material from conductively interconnecting the base layer with the conductive layer intersected by the prescribed depth portion of the first aperture.

* * * * *